United States Patent
Tsao et al.

(10) Patent No.: US 9,318,490 B2
(45) Date of Patent: Apr. 19, 2016

(54) SEMICONDUCTOR STRUCTURE AND MANUFACTURING METHOD THEREOF

(71) Applicant: UNITED MICROELECTRONICS CORP., Hsin-Chu (TW)

(72) Inventors: Po-Chao Tsao, New Taipei (TW); Yao-Hung Huang, Tainan (TW); Chien-Ting Lin, Hsinchu (TW); Ming-Te Wei, Changhua County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 206 days.

(21) Appl. No.: 14/153,079

(22) Filed: Jan. 13, 2014

(65) Prior Publication Data

US 2015/0200192 A1 Jul. 16, 2015

(51) Int. Cl.
*H01L 27/092* (2006.01)
*H01L 21/02* (2006.01)
*H01L 21/321* (2006.01)
*H01L 21/8238* (2006.01)
*H01L 21/8234* (2006.01)

(52) U.S. Cl.
CPC ...... *H01L 27/0922* (2013.01); *H01L 21/02164* (2013.01); *H01L 21/32115* (2013.01); *H01L 21/82385* (2013.01); *H01L 21/823842* (2013.01); *H01L 21/82345* (2013.01); *H01L 21/823437* (2013.01); *H01L 21/823456* (2013.01); *H01L 21/823828* (2013.01)

(58) Field of Classification Search
CPC .............. H01L 21/82385; H01L 27/0922; H01L 21/823842; H01L 29/66545
See application file for complete search history.

(56) References Cited

U.S. PATENT DOCUMENTS

| | | |
|---|---|---|
| 5,892,282 A | 4/1999 | Hong |
| 6,096,659 A | 8/2000 | Gardner |
| 6,177,303 B1 | 1/2001 | Schmitz |
| 6,303,418 B1 | 10/2001 | Cha |
| 6,458,684 B1 | 10/2002 | Guo |
| 6,573,134 B2 | 6/2003 | Ma |
| 6,960,416 B2 | 11/2005 | Mui |
| 7,126,199 B2 | 10/2006 | Doczy |
| 7,144,783 B2 | 12/2006 | Datta |
| 7,148,548 B2 | 12/2006 | Doczy |
| 7,153,784 B2 | 12/2006 | Brask |
| 7,176,090 B2 | 2/2007 | Brask |
| 7,186,605 B2 | 3/2007 | Cheng |
| 7,208,361 B2 | 4/2007 | Shah |
| 7,217,611 B2 | 5/2007 | Kavalieros |
| 7,355,281 B2 | 4/2008 | Brask |

(Continued)

*Primary Examiner* — Phat X Cao
*Assistant Examiner* — Diana C Vieira
(74) *Attorney, Agent, or Firm* — Winston Hsu; Scott Margo

(57) ABSTRACT

The present invention provides a semiconductor structure, including a substrate, having a dielectric layer disposed thereon, a first device region and a second device region defined thereon, at least one first trench disposed in the substrate within the first device region, at least one second trench and at least one third trench disposed in the substrate within the second device region, a work function layer, disposed in the second trench and the third trench, wherein the work function layer partially covers the sidewall of the second trench, and entirely covers the sidewall of the third trench, and a first material layer, disposed in the second trench and the third trench, wherein the first material layer covers the work function layer disposed on partial sidewall of the second trench, and entirely covers the work function layer disposed on the sidewall of the third trench.

8 Claims, 4 Drawing Sheets

(56) References Cited

U.S. PATENT DOCUMENTS

| | | |
|---|---|---|
| 7,407,876 B2 | 8/2008 | Ishizaka |
| 7,556,998 B2 | 7/2009 | Park |
| 7,700,479 B2 | 4/2010 | Huang |
| 2006/0024953 A1 | 2/2006 | Papa Rao |
| 2007/0145591 A1 | 6/2007 | Yano |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2009/0057769 A1 | 3/2009 | Wei |
| 2009/0186458 A1 | 7/2009 | Yu |
| 2010/0044783 A1 | 2/2010 | Chuang |
| 2010/0065926 A1 | 3/2010 | Yeh |
| 2010/0068877 A1 | 3/2010 | Yeh |
| 2010/0087055 A1 | 4/2010 | Lai |
| 2010/0124818 A1 | 5/2010 | Lee |
| 2010/0244141 A1 | 9/2010 | Beyer |
| 2012/0313178 A1* | 12/2012 | Liao ............... H01L 29/66545 257/368 |
| 2013/0187236 A1* | 7/2013 | Xie ............... H01L 29/4966 257/369 |
| 2014/0061811 A1* | 3/2014 | Chien ............... H01L 21/28088 257/369 |

\* cited by examiner

SEMICONDUCTOR STRUCTURE AND MANUFACTURING METHOD THEREOF

BACKGROUND OF THE INVENTION

1. Field of the Invention

The present invention relates to a semiconductor structure and the manufacturing method thereof, in particular, to a method for forming a semiconductor structure, and during the manufacturing process, performing the etching process for removing a work function layer only once.

2. Description of the Prior Art

Poly-silicon is conventionally used as a gate electrode in semiconductor devices, such as metal-oxide-semiconductors (MOS). With the trend towards scaling down the size of semiconductor devices, conventional poly-silicon gates face problems such as boron penetration and unavoidable depletion effect leading to inferior performance. Because of these problems, the equivalent thickness of the gate dielectric layer increases, reducing the gate capacitance, and lowering a driving force of the devices. Therefore, work function metals that are suitable for use as high dielectric constant (high-k) gate dielectric layers are employed to replace the conventional poly-silicon gates as control electrodes.

In a complementary metal-oxide semiconductor (CMOS) device, one of the dual work function metal gate structures is used in an NMOS device and the other one is used in a PMOS device. It is well known that compatibility and process controls for the dual metal gate structure is more complicated, while thickness and composition controls for materials used in dual metal gate structure methods are more precise.

Therefore, to improve the performance and the yield of the semiconductor devices, or to lower manufacturing costs and reduce the manufacturing time is an important research direction.

SUMMARY OF THE INVENTION

The present invention provides a semiconductor structure, comprising a substrate, having a first device region and a second device region defined thereon, at least one first trench disposed in the substrate within the first device region, at least one second trench and at least one third trench disposed in the substrate within the second device region, a work function layer, disposed in the second trench and the third trench, wherein the work function layer partially exposes the sidewall of the second trench, and entirely covers the sidewall of the third trench, and a first material layer, disposed in the second trench and the third trench, wherein the first material layer covers the work function layer disposed on partial sidewall of the second trench, and entirely covers the work function layer disposed on the sidewall of the third trench.

The present invention provides a method for forming a semiconductor structure, at least comprising the following steps: first, providing a substrate, having a first device region and a second device region defined thereon, next, forming at least one first trench in the substrate within the first device region, at least one second trench and at least one third trench in the substrate within the second device region, next, forming a work function layer in the first trench, the second trench and the third trench, and forming a first material layer in the first trench, the second trench and the third trench, wherein the first material layer exposes parts of the work function layer disposed in the first trench and disposed on the sidewall of the second trench, and entirely covers the work function layer disposed on the sidewall of the third trench, afterwards, forming a second material layer to fill the first trench and the second trench after the first material layer is formed, next, removing the first material layer and the second material layer in the first trench, afterwards, removing the second material layer in the second trench, and removing the work function layer in the first trench entirely, and removing partial work function layer in the second trench.

The feature of the present invention is using two material layers with different etching selectivity as hard masks, therefore during the manufacturing process, the etching process for removing the work function layer will be performed only once, thereby reducing the manufacturing process, and decreasing the N/P boundary issues.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
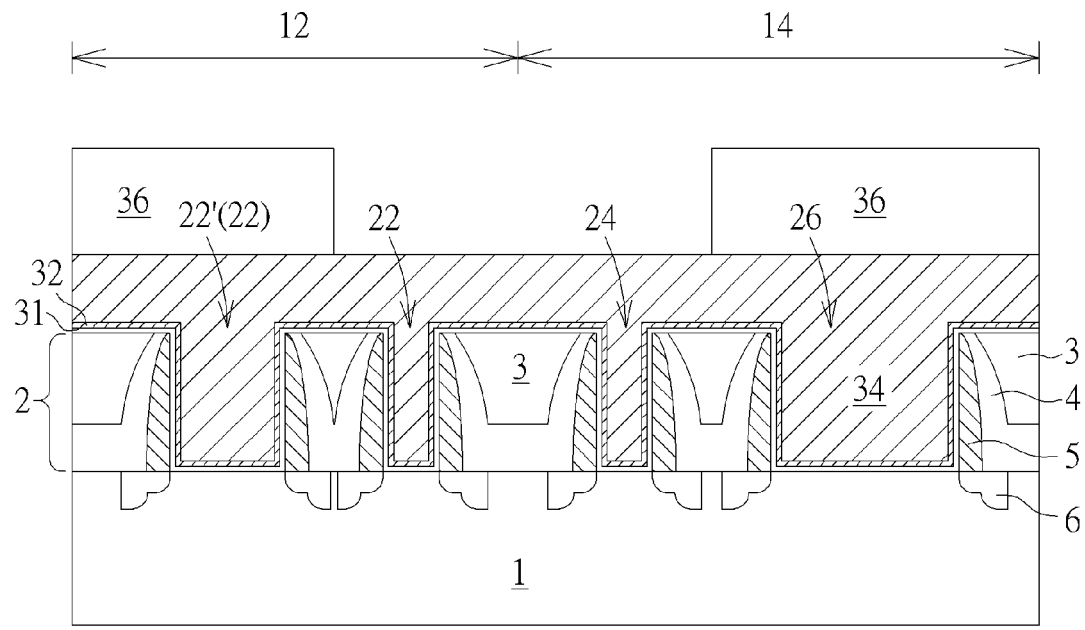
FIGS. 1-8 are schematic diagrams showing the manufacturing process for forming a semiconductor structure of the present invention.

Please refer to FIGS. 1-8, FIGS. 1-8 are schematic diagrams showing the manufacturing process for forming a semiconductor structure of the present invention. As shown in FIG. 1, a substrate 1 is provided, having a dielectric layer 2 disposed thereon, wherein the dielectric layer 2 may comprise an interlayer dielectric (ILD) 3, and a contact etching stop layer (CESL) 4. A first device region 12 and a second device region 14 are defined on the substrate 1, in this embodiment, the first device region 12 such as an NMOS region, and the second device region 14 such as a PMOS region, but not limited thereto. At least one first trench 22 is formed in the dielectric layer 2 within the first device region 12, and at least one second trench 24 and at least one third trench 26 are formed in the in the dielectric layer 2 within the second device region 14. In the present invention, the first trench 22 may have different bottom widths, for example, the present invention includes a first trench 22 and a first trench 22', wherein a bottom of the first trench 22' is wider than a bottom of the first trench 22, besides, a bottom of the third trench 26 is wider than a bottom of the second trench 24. It can be understood that that in this present invention, there are two first trenches (including the first trench 22 and the first trench 22') within the first device region 12, one second trench 24 and one third trench 26 within the second device region 14, but the present invention is not limited thereto. The semiconductor structure of the present invention may comprise a plurality of the first trenches 22, the second trenches 24 and the third trenches 26. In addition, the semiconductor structure of the present invention may comprise a plurality of spacers 5 disposed on two sides of each trench (including the first trench 22, the second trench 24 and the third trench 26), and a plurality of source/drain (S/D) regions 6 disposed in the substrate 1. The method for forming the dielectric layer 2, the spacer 5 and the S/D region 6 are well known by the person of ordinary skills, and will not be redundantly described here.

As shown in FIG. 1, a high-k (high dielectric constant) layer 31 and a first work function layer 32 are conformally formed on the dielectric layer 2. In other words, the high-k layer 31 and the first work function layer 32 at least cover the bottom the sidewalls of each trench (including the first trench 22, the second trench 24 and the third trench 26). Afterwards, a first material layer 34 is formed on the dielectric layer 2, and filled in each first trench 22, each second trench 24 and each third trench 26. In this embodiment, the first material layer 34 comprises organo-siloxane, but not limited thereto. Next, a patterned photoresist layer 36 is formed on the first material layer 34, at least disposed right above the third trench 26 within the second device region 14, and the disposed right above the first trench 22' with wider bottom within the first device region 12. It is worth noting that the present invention uses a high-k last and gate last process, the method is well known by the person of ordinary skills, and will not be redundantly described here.

Figure 2:
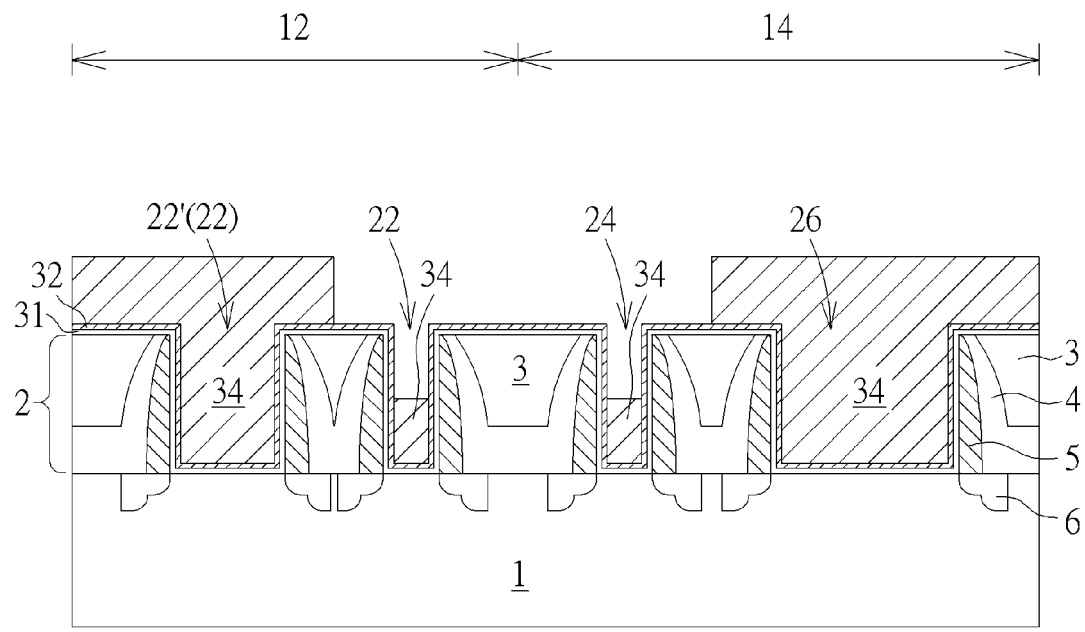

Next, as shown in FIG. 2, an etching process is performed, to remove parts of the first material layer 34 in each first trench 22 and in each second trench 24, and the first work function layer 32 is partially exposed, but it is worth noting that there are still some first material layer 34 remaining in in each first trench 22 and in each second trench 24, so the first work function layer 32 disposed on the bottom of each trench is still covered by the first material layer 34. After the etching process is performed, the patterned photoresist layer 36 is then removed.

Figure 3:
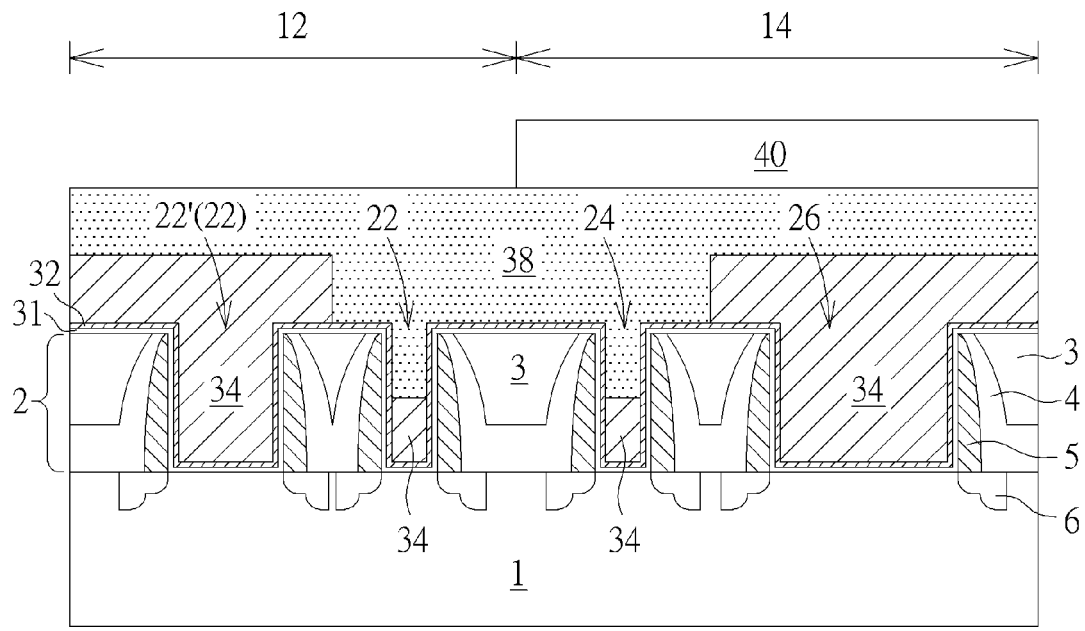

As shown in FIG. 3, a second material layer 38 is then formed on the first material layer 34, and filled in the first trench 22 and the second trench 24. In this embodiment, the second material layer 38 is made of different materials with the first material layer 34 made of mainly polymer, but not limited thereto. Afterwards, a patterned photoresist layer 40 is formed on the second material layer 38 within the second device region 14. In other words, the patterned photoresist layer 40 is at least disposed right above the second trench 24 and the third trench 26, to protect the layers dispose under it during the etching process performed in the following steps.

Figure 4:
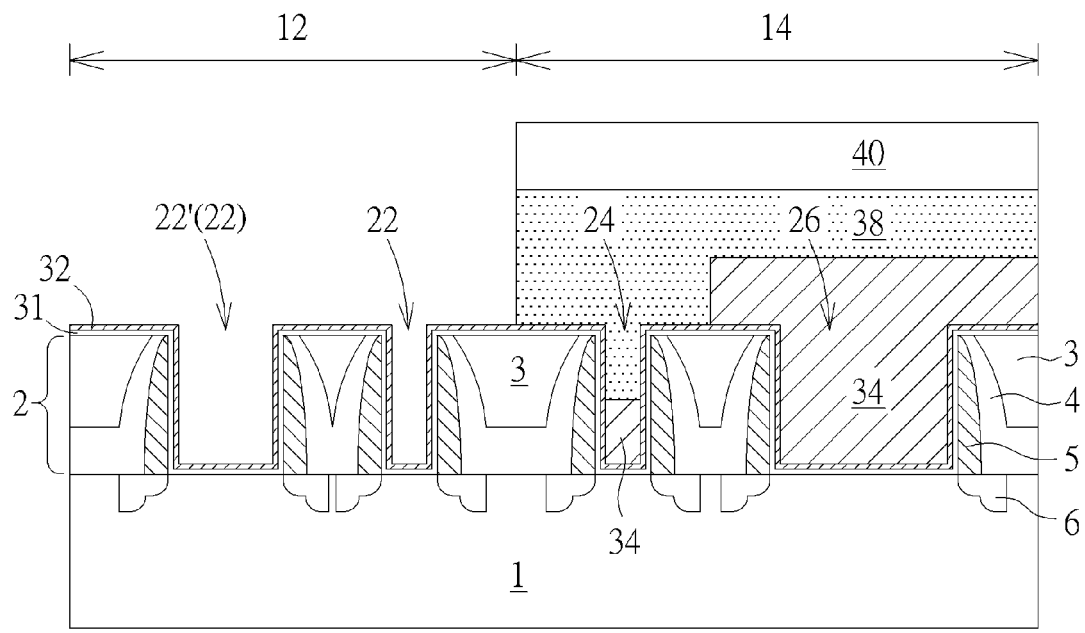

Afterwards, as shown in FIG. 4, an etching process is then performed, the etching process including a wet etching process or dry etching process, to remove parts of the first material layer 34 and parts of the second material layer 38 that are not covered by the patterned photoresist layer 40, in other words, the first material layer 34 and the second material layer 38 disposed in the first trench 22 is completely removed, and the first work function layer 32 within the first device region 12 is exposed.

Figure 5:
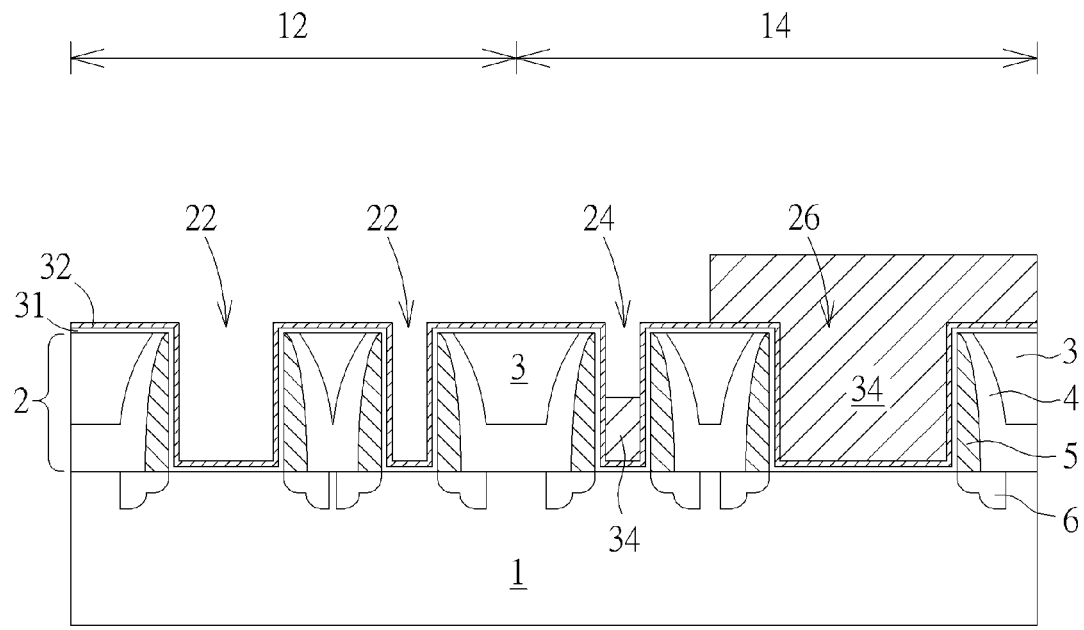

As shown in FIG. 5, the patterned photoresist layer 40 is removed, and the second material layer 38 is then removed through an etching process. It is worth noting that in this embodiment, only the second material layer 38 is removed, but the first material layer 34 is remains. Since the first material layer 34 and the second material layer 38 comprise different materials, they have different etching selectivity. In other words, the first material layer 34 and the second material layer 38 have different consumption rate during an etching process, so the etching process uses the solvents (wet etching process) or gases (dry etching process) that can etch the second material layer 38 effectively but that will hardly etch the first material layer 34. So only the first material layer 34 will remain, and the second material layer 38 is removed after this etching process is performed. In addition, since the second material layer 38 is removed, parts of the first work function layer 32 within the first device region 12 are exposed. The first work function layer 32 disposed in the first trenches 22 and disposed on partial sidewall (the upper portion of the sidewall) of the second trench 24 is especially exposed. Therefore, it can help to reduce the loading effect and prevent fast consumption of the first material layer 34 and the first work function layer 32 being etched in subsequent etching process in the third trench 26.

Figure 6:
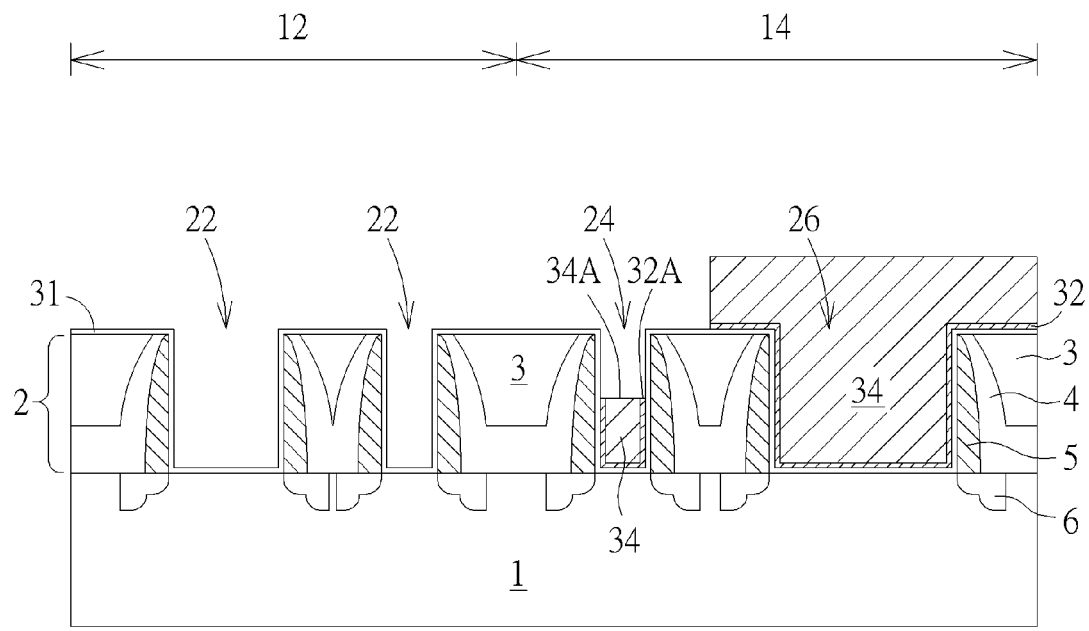

Afterwards, another etching process is then performed, to remove the exposed first work function layer 32, as shown in FIG. 6. Within the first device region 12, after the etching process is performed, the first work function layer 32 disposed in each first trench 22 is completely removed, but within the second device region 14, in the second trench 24, only parts of the first work function layer 32 are removed. Only the first work function layer 32 disposed on the upper portion sidewall of the second trench 24 is removed, and there are still some portion first work function layer 32 remaining on the bottom and on the lower portion of the second trench 24. In the third trench 26, since the first work function layer 32 is covered by the first material layer 34, the first work function layer 32 entirely covers the sidewalls and the bottom of the third trench 26, and the first work function layer 32 is also disposed on the dielectric layer 2 surrounding the third trench 26. It is worth noting that in the present invention, the etching process for removing the work function layer is performed only once.

In the semiconductor structure of the present invention, as shown in FIG. 6, since some first work function layer 32 disposed in the second trench 24 is protected by the first material layer 34 during the etching process for removing the first work function layer 32, in the second trench 24, the first material layer 34 covers the first work function layer 32 disposed on a partial sidewall (especially the lower portion) and the bottom of the second trench 24. Besides, a top surface 34A of the first material layer 34 and a top surface 32A of the first work function layer 32 are on the same level.

Figure 7:
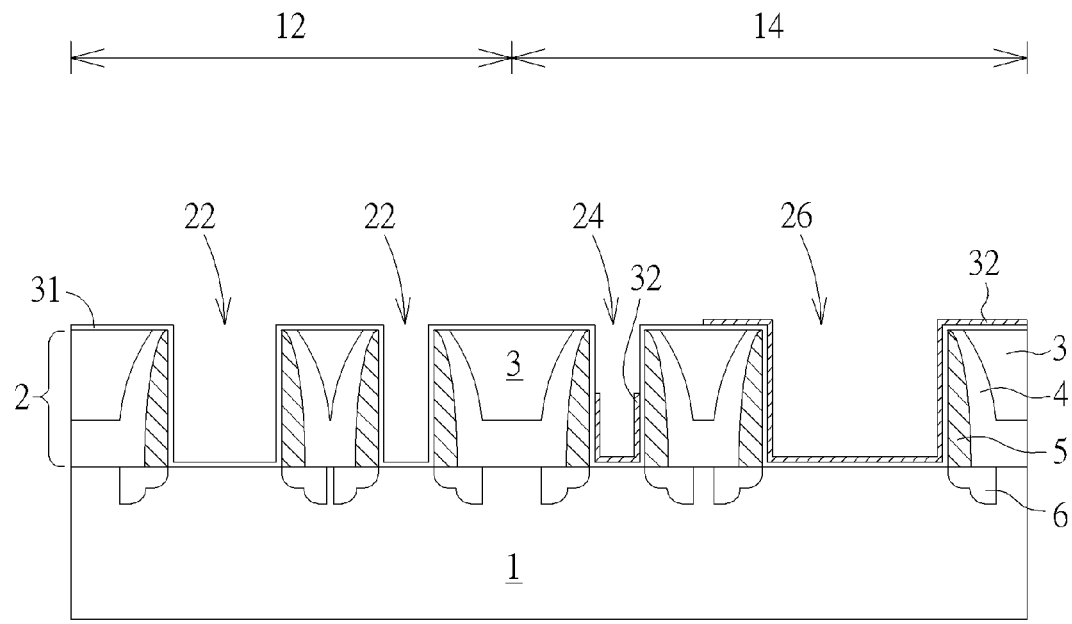
Figure 8:
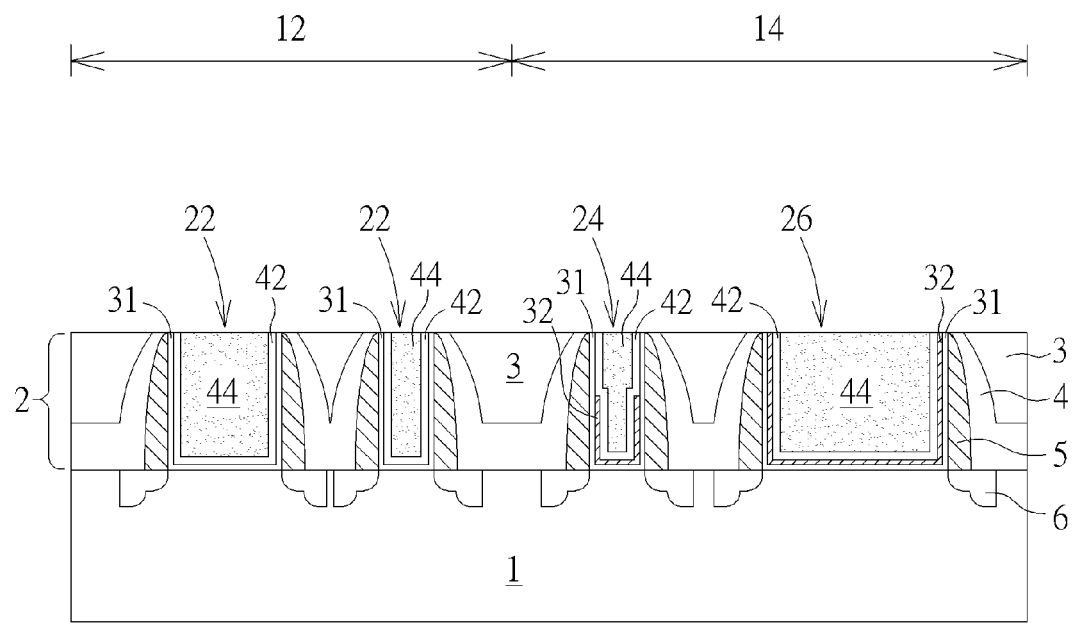

Please refer to FIGS. 7-8. As shown in FIG. 7, the remaining first material layer 34 is removed and afterwards, as shown in FIG. 8, an optional second work function layer 42 and a conductive material layer 44 are then formed in the first trenches 22, the second trenches 24 and in the third trenches 26. Finally, a planarization process such as a chemical mechanical polishing (CMP) process is then performed, to remove the extra high-k layer 31, first work function layer 32, second work function layer 42 or conductive material layer 44 disposed on the dielectric layer 2.

In the present invention, The high-k layer 31 may be selected from a group comprising hafnium oxide ($HfO_2$), hafnium silicon oxide ($HfSiO_4$), hafnium silicon oxynitride (HfSiON), aluminum oxide ($Al_2O_3$), lanthanum oxide ($La2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi1-xO_3$, PZT) and barium strontium titanate ($Ba_xSr1-xTiO_3$, BST). The first work function layer 32 may include an intrinsic work function, and the first work function layer 32 may be a p-type work function layer, an n-type work function layer, or a composite layer including both the p-type work function layer and the n-type work function layer. The first work function layer 32 and the second work function layer 42 may include titanium nitride (TiN), titanium carbide (TiC), tantalum nitride (TaN), tantalum carbide (TaC), tungsten carbide (WC), titanium tri-aluminide (TiAl$_3$) or aluminum titanium nitride (TiAlN), but not limited thereto, preferably, the first work function layer 32 and the second work function layer 42 comprise different work function materials, such as a p-type work function material and an n-type work function material respectively. The conductive material layer 44 may be a multi-materials layer, including a low resistance conductive material such as aluminum (Al), tungsten (W), copper (Cu), titanium aluminide (TiAl), and titanium aluminum oxide (TiAlO). The first material layer 34 and the second material layer 38 have different etching selectivity, for example, first material layer 34 comprises organo-siloxane, such as a light absorbing Si-content polymer layer (for example, the present invention uses DUO™ as the first material layer, which is a product manufactured by Honeywell company), and the second material layer 38 comprises polymers, such as a bottom anti-reflection coating (BARC) layer, but not limited thereto, the material of the first material layer 34 and the second material layer 38 can be adjusted according to actual requirements. However, the condition that the first material layer 34 and the second material layer 38 have different etching selectivity still needs to be satisfied.

The feature of the present invention is using two material layers—the first material layer 34 and the second material layer 38 with different etching selectivity as hard masks. Therefore during the manufacturing process, the etching process for removing the first work function layer 32 will be performed only once, thereby reducing the manufacturing process, and decreasing the N/P boundary issues.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, at least comprising the following steps:

providing a substrate, having a dielectric layer disposed thereon, a first device region and a second device region defined thereon;

forming at least one first trench in the dielectric layer within the first device region, at least one second trench and at least one third trench in the substrate within the second device region;

forming a first work function layer in the first trench, the second trench and the third trench;

forming a plurality of first material layers in the first trench, the second trench and the third trench, wherein the first material layer covers parts of the first work function layer disposed in the first trench and disposed on the sidewall of the second trench, and entirely covers the first work function layer disposed on the sidewall of the third trench;

forming a second material layer to fill the first trench and the second trench after the first material layer is formed;

removing the first material layer and the second material layer in the first trench;

removing the second material layer in the second trench; and removing the first work function layer in the first trench entirely, and removing a partial first work function layer disposed in the second trench.

2. The method of claim 1, further comprising forming a high-k layer in the first trench, the second trench and the third trench.

3. The method of claim 1, after the first work function layer in the second trench is partially removed, further comprising forming a second work function layer and a conductive layer in the first trench, the second trench and the third trench.

4. The method of claim 3, after the second work function layer and the conductive layer is formed, further comprising performing a planarization process.

5. The method of claim 1, wherein the material of the first material layer comprises organo-siloxane.

6. The method of claim 1, wherein the material of the second material layer comprises polymer.

7. The method of claim 1, wherein a bottom of the third trench is wider than a bottom of the second trench.

8. The method of claim 1, wherein the first material layer and the second material layer have different etching selectivity.

* * * * *